(12) United States Patent
Kirby

(10) Patent No.: US 6,998,345 B2
(45) Date of Patent: Feb. 14, 2006

(54) METHODS OF FORMING VIA PLUGS USING AN AEROSOL STREAM OF PARTICLES TO DEPOSIT CONDUCTIVE MATERIAL

(75) Inventor: Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/999,344

(22) Filed: Nov. 30, 2004

(65) Prior Publication Data

US 2005/0101129 A1 May 12, 2005

Related U.S. Application Data

(63) Continuation of application No. 10/613,235, filed on Jul. 3, 2003, now Pat. No. 6,855,631.

(51) Int. Cl.
*H01L 21/441* (2006.01)

(52) U.S. Cl. .................. 438/667; 438/675; 438/686

(58) Field of Classification Search ............... 438/637, 438/641, 667, 675, 678, 686; 427/97.7, 110, 427/125, 191, 192, 236, 383.1, 422, 455, 427/597
See application file for complete search history.

(56) References Cited

U.S. PATENT DOCUMENTS

| | | | |
|---|---|---|---|
| 5,343,434 A | 8/1994 | Noguchi | |
| 5,529,634 A | 6/1996 | Miyata et al. | |
| 6,042,953 A | 3/2000 | Yamaguchi et al. | |
| 6,251,488 B1 | 6/2001 | Miller et al. | |
| 6,288,442 B1 | 9/2001 | Farrar | |
| 6,355,533 B2 | 3/2002 | Lee | |
| 6,538,323 B1 | 3/2003 | Sakata et al. | |
| 6,855,631 B2 * | 2/2005 | Kirby | ............... 438/667 |
| 2003/0194860 A1 | 10/2003 | Nemoto | |

OTHER PUBLICATIONS

B. King, M. Renn and M Essien, M³D Technology, Maskless Mesoscale™ Materials Deposition, "M³D Technology deposits electronic materials onto low-temperature, non-planar substrates without masks or resists," Optomec, Inc. M³D, Maskless Mesoscale™ Materials Deposition, Optomec, Inc.

* cited by examiner

*Primary Examiner*—Stephen W. Smoot
(74) *Attorney, Agent, or Firm*—Leffert Jay & Polglaze, P.A.

(57) ABSTRACT

An aerosol stream of particles of a conductive material is directed into a via of an integrated circuit device to deposit the conductive material within the via to form a via plug.

20 Claims, 6 Drawing Sheets

METHODS OF FORMING VIA PLUGS USING AN AEROSOL STREAM OF PARTICLES TO DEPOSIT CONDUCTIVE MATERIAL

CROSS REFERENCE TO RELATED APPLICATIONS

This is a continuation application of U.S. patent application Ser. No. 10/613,235, filed Jul. 3, 2003, issued as U.S. Pat. No. 6,855,631 and titled "METHODS OF FORMING VIA PLUGS USING AN AEROSOL STREAM OF PARTICLES TO DEPOSIT CONDUCTIVE MATERIAL," which application is commonly assigned, the entire contents of which are incorporated herein by reference.

TECHNICAL FIELD OF THE INVENTION

The present invention relates generally to integrated circuit fabrication and in particular the present invention relates to forming via plugs.

BACKGROUND OF THE INVENTION

Semiconductor integrated circuit devices typically include conductive layers, e.g., metal layers, separated by nonconductive layers. Conductive via plugs disposed in vias of an integrated circuit device usually interconnect conductive layers within the circuit device. For some applications, via plugs extend into active areas of an integrated circuit device to connect the active areas to contacts or wiring layers adjacent an exterior of the device.

One method of forming via plugs involves blanketing a nonmetal layer, such as a dielectric layer, of an integrated circuit device with a metal layer so that the metal fills vias disposed in the nonmetal layer. The metal layer is usually formed by chemical vapor deposition (CVD), physical vapor deposition (PVD) (or sputtering), electroless plating, electroplating, etc. Excess metal overlying the dielectric layer is removed, such as by chemical-mechanical planarization (CMP), to define the via plugs. This is a complicated and time-consuming, and thus expensive, process.

For the reasons stated above, and for other reasons stated below which will become apparent to those skilled in the art upon reading and understanding the present specification, there is a need in the art for alternative methods for forming via plugs.

SUMMARY

The above-mentioned problems with forming via plugs and other problems are addressed by the present invention and will be understood by reading and studying the following specification.

The various embodiments relate to methods for forming a via plug in a via disposed in a substrate or in a dielectric layer disposed on a base layer of an integrated circuit device. The inventive methods enable formation of discrete via plugs. This avoids the need to form a metal blanket layer and thus reduces the amount of excess metal that needs to be removed.

For one embodiment, the invention provides a method of forming a via plug including directing an aerosol stream of particles of a conductive material into a via of an integrated circuit device to deposit the conductive material within the via.

For another embodiment, the invention provides a method of forming a via plug including directing an aerosol stream of particles of a first conductive material onto a sidewall of a via disposed in a substrate or in a dielectric layer disposed on a base layer of an integrated circuit device to form a seed layer of the first conductive material on the sidewall. The method also includes plating the seed layer with a second conductive material.

For another embodiment, the invention provides a method of manufacturing an integrated memory circuit, where the memory circuit comprises an array of memory cells connected to column and row address decoders and a sensing circuit. The method includes forming a via plug in the memory circuit by directing an aerosol stream of particles of a conductive material into a via of the memory circuit to deposit the conductive material within the via.

For another embodiment, the invention provides a method of forming an integrated circuit device. The method includes forming a dielectric layer on a base layer of the integrated circuit device and forming a via in the dielectric layer terminating at the base layer. Forming a via plug within the via by directing an aerosol stream of particles of a conductive material into the via to deposit the conductive material within the via contacting the base layer is also included in the method.

Further embodiments of the invention include methods of varying scope.

DETAILED DESCRIPTION

Figure 1:
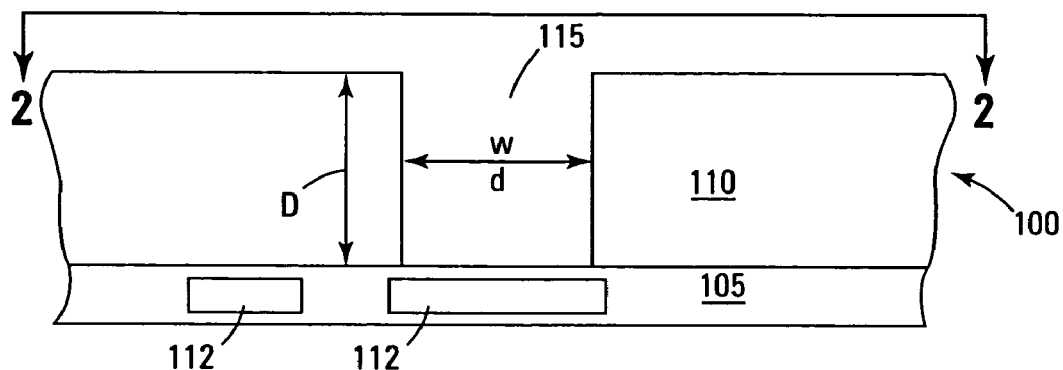
FIGS. 1 and 2 are respectively cross-sectional and top views of a portion of an integrated circuit device during fabrication according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 2:
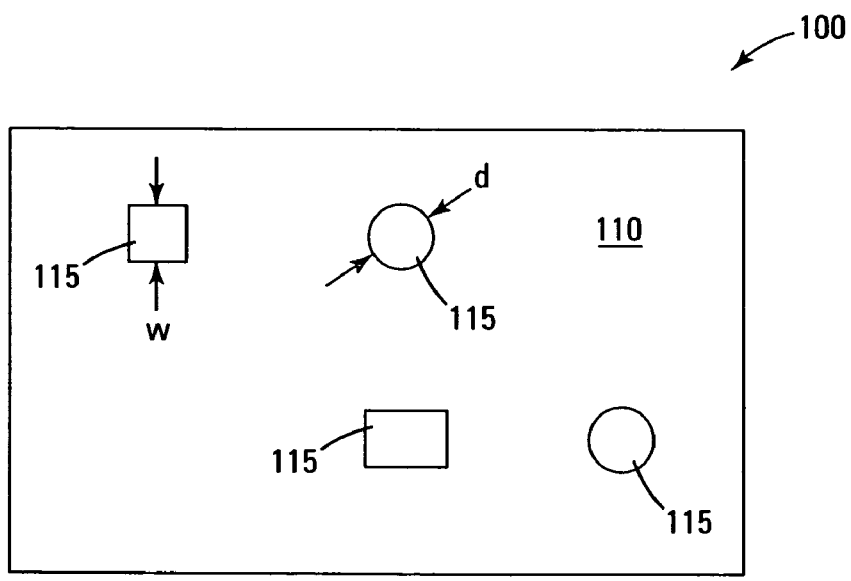

FIGS. 1 and 2 are respectively cross-sectional and top views of a portion of an integrated circuit device 100, such as an integrated memory circuit device, during fabrication according to an embodiment of the present invention. A dielectric layer 110 is formed on a base layer 105. For one embodiment, base layer 105 is a semiconductor substrate, such as a monocrystalline silicon substrate. Other semiconductor substrates are known and used in the art of semiconductor fabrication. For additional embodiments, base layer 105 may be a conductor layer. For example, base layer 105 may be a metal line, a wiring layer, or other conductive interconnect, such as a Metal 1 layer, Metal 2 layer, Metal 3 layer, etc. For one embodiment, base layer 105 is an active area of integrated circuit device 100 that includes one or more integrated circuit elements 112, such as transistors, capacitors, etc.

Dielectric layer 110 contains an insulator or dielectric material, such as a silicon oxide ($SiO/SiO_2$), silicon nitride ($SiN/Si_2N/Si_3N_4$), or silicon oxynitride ($SiO_xN_y$) material. For one embodiment, the dielectric layer 110 contains a doped silicon oxide material, such as borophosphosilicate glass (BPSG), a boron- and phosphorous-doped silicon dioxide material. Other dielectric materials are known and used in the art of semiconductor fabrication.

The dielectric layer 110 is patterned to define apertures, such as blind-hole vias 115 that terminate at base layer 105 as depicted in FIGS. 1 and 2. For one embodiment, vias 115 have circular or square cross-sections, depending on the technique used for forming vias 115. Patterning of the dielectric layer 110 may include conventional photolithographic techniques to mask portions of the dielectric layer 110 and to expose portions of the dielectric layer 110 where future vias 115 are to be formed. The exposed portions of the dielectric layer 110 are then removed. The portions of the dielectric layer 110 may be removed by etching or other suitable removal technique known in the art. Removal techniques are generally dependent upon the material of construction of the layer to be removed as well as the surrounding or underlying layers to be retained. For one embodiment, laser drilling forms vias 115. For another embodiment, vias 115 have an aspect ratio (via depth D/via width w or diameter d) of around six to ten. For other embodiments, w or d is around 50 to 100 microns, and D is around 500 to 600 microns.

Figure 3:
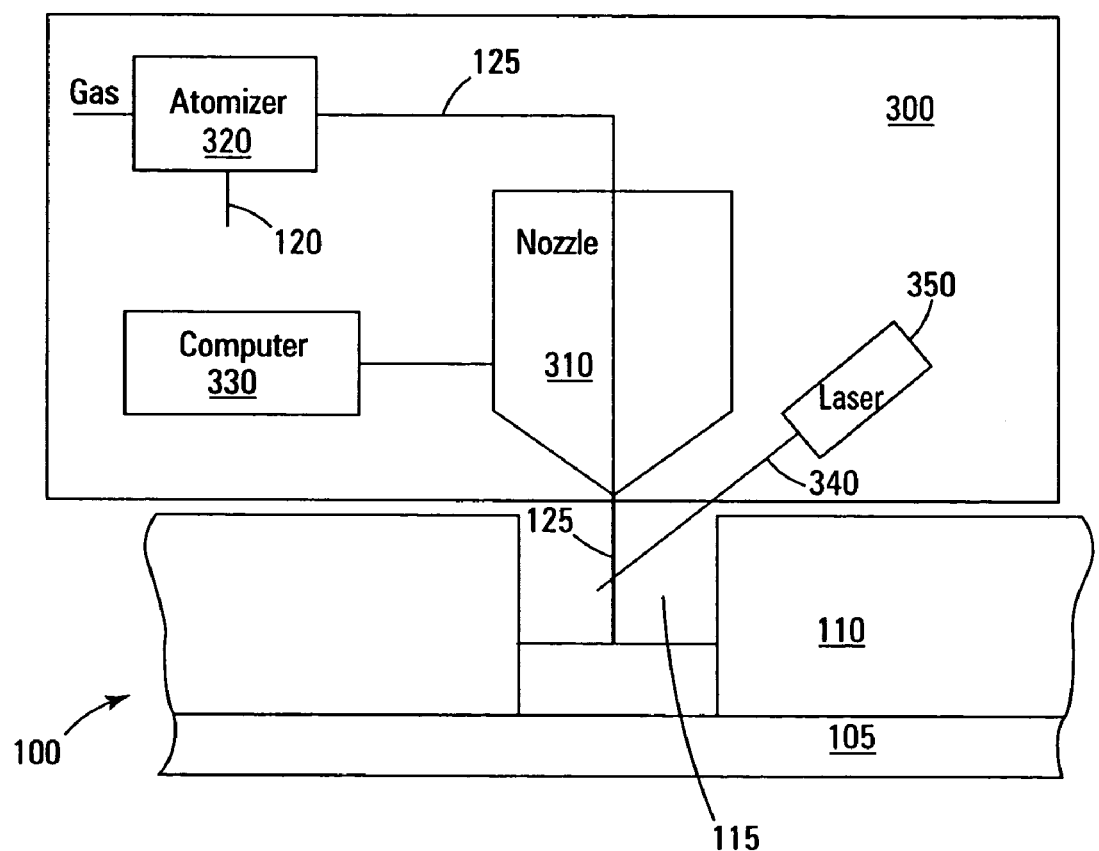
FIG. 3 illustrates a material deposition system depositing conductive material in a via according to another embodiment of the present invention.

Following patterning of the dielectric layer 110, conductive via plugs are formed within vias 115. For one embodiment, a material deposition system 300 is used to deposit a conductive material 120, for example, a silver-, copper-, or gold-based material, in vias 115, as shown in FIG. 3, for forming the via plugs on at a time. This avoids the need to form a metal blanket layer on dielectric layer 110, as is done in some methods for forming via plugs, and thus reduces the amount of excess metal that needs to be removed from dielectric layer 110. As used herein, a silver-, copper-, or gold-based material includes any material comprising a substantial amount of silver-, copper-, or gold. For example, materials containing ten or more percent (by weight) of silver, copper, or gold constitute a silver-, copper-, or gold-based material. For one embodiment, material deposition system 300 is a MASKLESS MESOSCALE MATERIALS DEPOSITION ($M^3D$) System manufactured by Optomec Design Company (Albuquerque, N. Mex., U.S.A.).

In operation, material deposition system 300 aerosolizes solid particles (e.g., nano-particles as small as about 20 nanometers) of conductive material 120 to form an aerosol stream 125 containing the particles of conductive material 120. Material deposition system 300 discharges aerosol stream 125 through a nozzle 310, as shown in FIG. 3. For some embodiments, an atomizer 320, such as a pneumatic nebulizer, a sonic transducer, or the like, produces aerosol stream 125 from a gas flow and the solid particles of conductive material 120. For one embodiment, a computer 330 is programmed to position nozzle 310 over each of vias 115 and to control the deposition of conductive material 120 in each of vias 115. For another embodiment, material deposition system 300 deposits line widths as small as one micron.

For various embodiments, the solid particles are aggregated before or after deposition so that the via plugs are a coherent mass of conductive material 120. For one embodiment, liquefying the solid particles aggregates the solid particles. For another embodiment, aerosol stream 125 passes through a laser beam 340 of laser 350, and laser beam 340 imparts energy to the solid particles of conductive material 120 for liquefying the solid particles. For this embodiment, conductive material 120 is deposited in a liquid state and subsequently solidifies. In other embodiments, conductive material 120 is deposited in vias 115 as solid particles, and laser beam 340 is applied to conductive material 120 after deposition to aggregate the particles as a part of a laser sintering process. For another embodiment, after depositing the solid particles of conductive material 120 in vias 115, heating integrated circuit device 100 and the particles contained in vias 115 in an oven aggregates the solid particles, e.g., by sintering or liquefying the solid particles.

Figure 4:
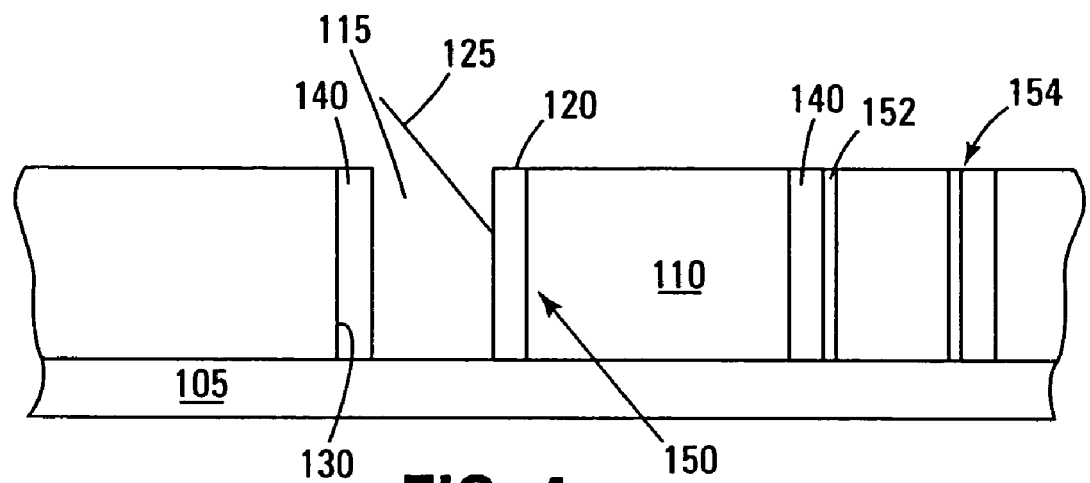
FIG. 4 is a cross-sectional view illustrating formation of a hollow via plug according to another embodiment of the present invention.

For another embodiment, aerosol stream 125 is directed on a sidewall 130 of vias 115 for depositing conductive material 120 as a coating 140 on sidewall 130, as shown in FIG. 4. For this embodiment, conductive material 120 forms a hollow via plug 150. For one embodiment, coating 140 serves as a seed (or starter) layer to control placement of a material 152, e.g., a silver- copper-, or gold-based material, deposited during subsequent selective deposition processes, such as electroplating, electroless plating, etc, on coating 140 to form a hollow via plug 154. For one embodiment, coating 140 is silver and via plug 154 is formed by plating coating 140 with copper or silver. For another embodiment, aerosol stream 125 deposits a coating of conductive material 120 on a portion of sidewall 130 and a via is formed by plating that seed layer.

Figure 5:
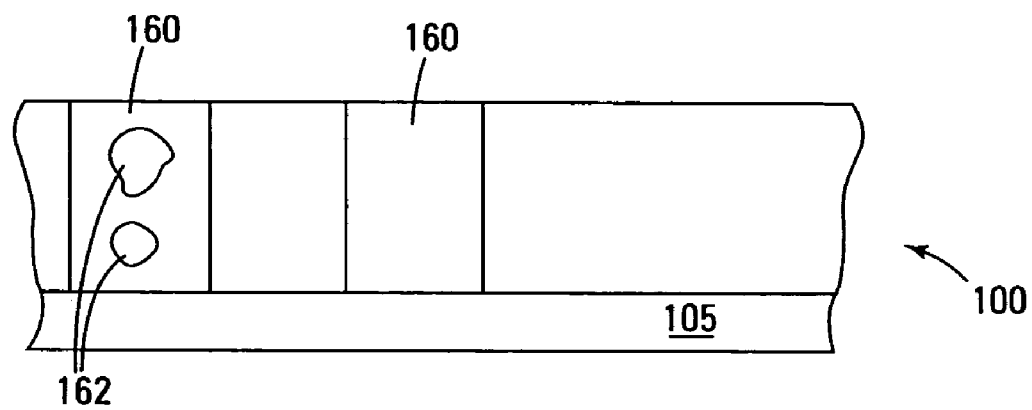
FIG. 5 is a cross-sectional view illustrating solid via plugs according to another embodiment of the present invention.

FIG. 5 illustrates a solid via plug 160 formed in dielectric layer 110 of integrated circuit device 100 using material deposition system 300 to fill via 115 according to another embodiment of the present invention. In some instances, voids 162 (e.g., air pockets) can form within solid via plug 160, as shown in FIG. 5. This does not present a problem, however, as long as voids 162 do not interrupt electrical continuity. For some embodiments, filling vias 115 in an evacuated chamber acts to reduce the chances of void formation.

Figure 6:
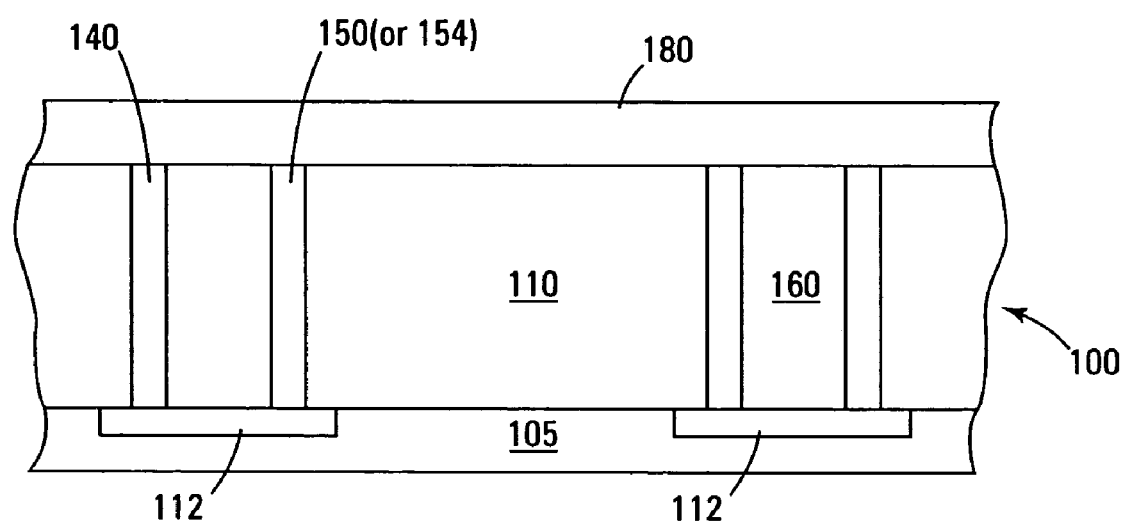
FIG. 6 is a cross-sectional view illustrating vias connecting integrated circuit elements to a metal layer of integrated circuit device according to another embodiment of the present invention.

FIG. 6 illustrates vias 150 (or 154) and 160 connecting integrated circuit elements 112 to a metal layer 180 formed on dielectric layer 110 of integrated circuit device 100 using any suitable deposition technique, such as chemical vapor deposition (CVD), physical vapor deposition (PVD), electroplating, electroless plating, etc. For one embodiment, metal layer 180 is a wiring layer.

Figure 7:
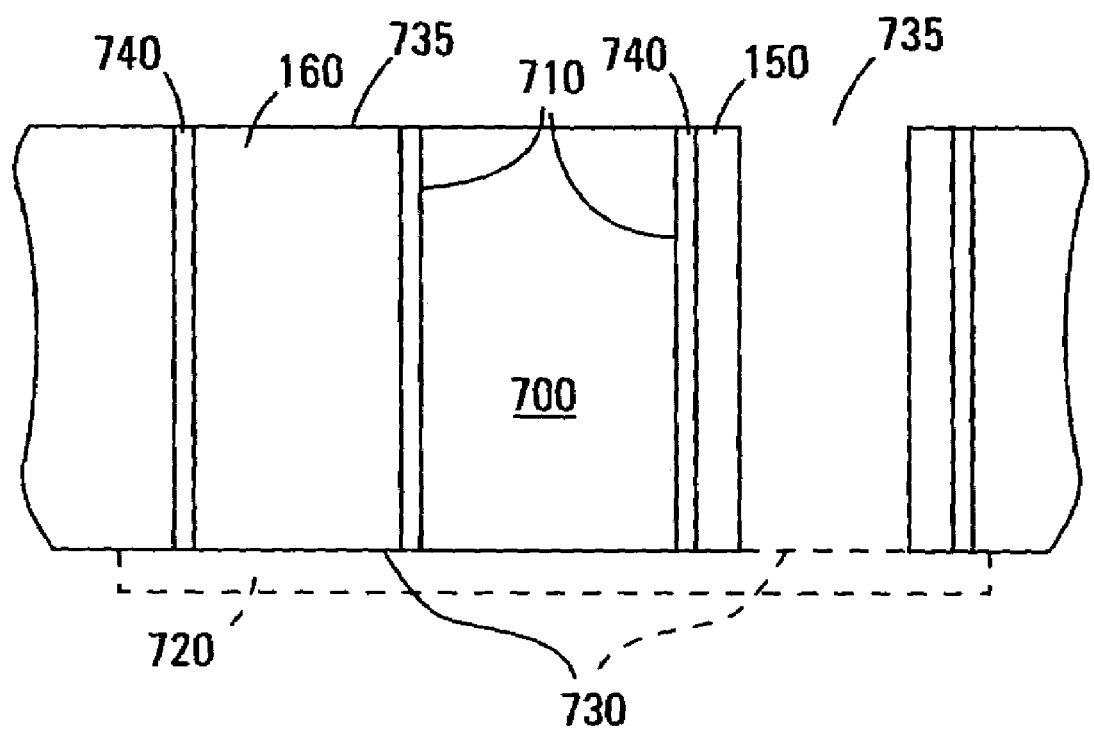
FIG. 7 is cross-sectional view of a semiconductor substrate having through-hole vias containing hollow and solid via plugs according to another embodiment of the present invention.

FIG. 7 is cross-sectional view of a semiconductor substrate 700 having through-hole vias 710 passing completely therethrough according to another embodiment of the present invention. Laser drilling or any suitable wet or dry etching process can form vias 710. For one embodiment, solid via plugs 160 and/or hollow via plugs 150 are formed in vias 710 as described above using material deposition system 300. For another embodiment, before forming the via plugs, a cover layer 720, such as tape, is removably attached to substrate 700 so as to cover an end 730 of each of vias 710. This prevents conducting material 120 from leaking through ends 730 during deposition of conducting material 120 though ends 735 of vias 710. For another embodiment, a diffusion barrier layer 740 is formed on a sidewall of a vias 710 before forming via plugs 150 and/or 160. For one embodiment, diffusion barrier layer 740 is a titanium-containing layer, such as a titanium nitride layer.

Figure 8:
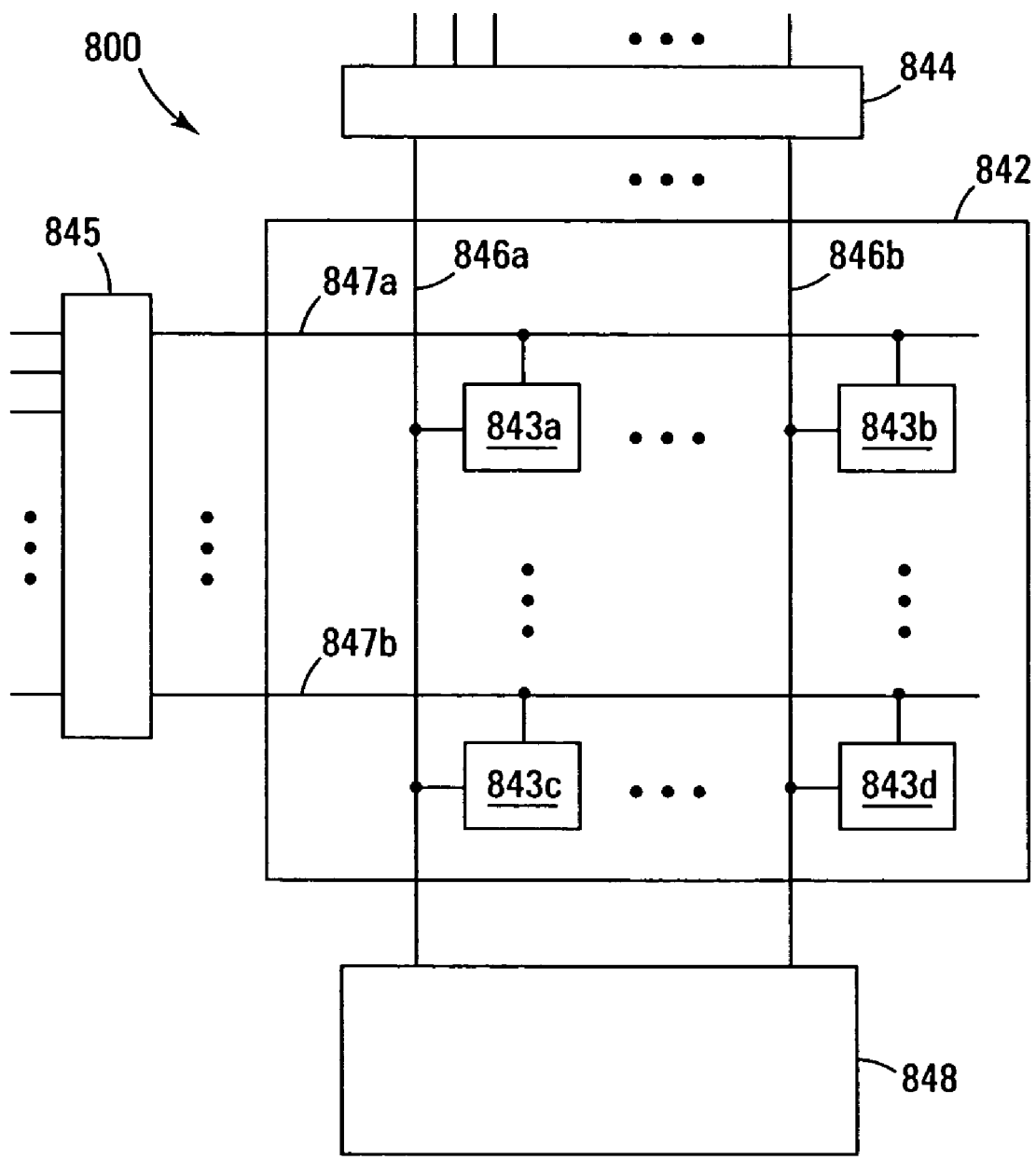
FIG. 8 shows a generic integrated memory circuit according to another embodiment of the present invention.

FIG. 8 shows a generic integrated memory circuit 800 according to another embodiment of the present invention. Circuit 800, which operates according to well-known and understood principles, is generally coupled to a processor (not shown) to form a computer system. More precisely, circuit 800 includes a memory array 842 that has a number of memory cells 843a–843d, a column address decoder 844, a row address decoder 845, bit lines 846, word lines 847, and sensing circuit 848 coupled to bit lines 846. For one embodiment, manufacture of circuit 800 includes forming one or more via plugs as described above.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a via plug, the method comprising:
    aerosolizing pre-existing solid particles of a conductive material to form an aerosol stream of particles; and
    directing the aerosol stream of particles into a via of an integrated circuit device to deposit the conductive material within the via.

2. The method of claim 1, wherein the via is disposed in a substrate or in a dielectric layer disposed on a base layer of the integrated circuit device.

3. The method of claim 2, wherein the base layer is a metal layer or an active area of the integrated circuit device.

4. The method of claim 1, further comprising liquefying the particles by passing the aerosol stream through a laser beam before the conductive material is deposited in the via.

5. The method of claim 1, further comprising while the particles are in the via, sintering the particles.

6. The method of claim 5, wherein sintering the particles comprises using a laser or heating the particles and the integrated circuit device in an oven.

7. The method of claim 1, further comprising covering an end of the via while the aerosol stream passes through an opposite end of the via.

8. The method of claim 1, wherein directing an aerosol stream of particles of a conductive material into a via comprises directing the aerosol stream on a sidewall of the via for coating the sidewall to form a hollow via plug.

9. The method of claim 1, wherein the particles of the conductive material are nano-particles.

10. The method of claim 1, wherein the via is a blind-hole via that terminates at a base layer or a through-hole via that passes completely through a substrate.

11. The method of claim 1, wherein the conductive material is a silver-based material.

12. A method of forming an integrated circuit device, the method comprising:
    forming a dielectric layer on a base layer of the integrated circuit device;
    forming a via in the dielectric layer terminating at the base layer; and
    forming a via plug within the via by aerosolizing pre-existing solid particles of a conductive material to form an aerosol stream of particles and directing the aerosol stream of particles into the via to deposit the conductive material within the via contacting the base layer.

13. The method of claim 12, further comprising aggregating the particles before or after depositing the conductive material within the via.

14. The method of claim 12, further comprising forming a metal layer on the dielectric layer in contact with the via plug so that the via plug interconnects the metal layer and the base layer.

15. The method of claim 12, wherein the base layer comprises integrated circuit elements.

16. The method of claim 12, wherein directing an aerosol stream of particles of a conductive material into a via comprises directing the aerosol stream on a sidewall of the via for coating the sidewall to form a hollow via plug.

17. A method of manufacturing an integrated memory circuit, wherein the memory circuit comprises an array of memory cells connected to column and row address decoders and a sensing circuit, the method comprising:
    forming a via plug in the memory circuit by aerosolizing pre-existing solid particles of a conductive material to form an aerosol stream of particles and directing the aerosol stream of particles into a via of the memory circuit to deposit the conductive material within the via.

18. The method of claim 17, further comprising, before forming the via plug:
    forming a dielectric layer on a base layer of the memory circuit; and
    forming the via in the dielectric layer.

19. The method of claim 18, further comprising forming a metal layer on the dielectric layer in contact with the via plug so that the via plug interconnects the metal layer and the base layer.

20. The method of claim 17, further comprising aggregating the particles before or after depositing the conductive material within the via.

* * * * *